United States Patent
Uemichi

(10) Patent No.: US 10,003,115 B2
(45) Date of Patent: Jun. 19, 2018

(54) TERMINATOR AND TERMINATION METHOD

(71) Applicant: Fujikura Ltd., Tokyo (JP)

(72) Inventor: Yusuke Uemichi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 26 days.

(21) Appl. No.: 15/374,143

(22) Filed: Dec. 9, 2016

(65) Prior Publication Data

US 2017/0179560 A1 Jun. 22, 2017

(30) Foreign Application Priority Data

Dec. 17, 2015 (JP) .................. 2015-246392

(51) Int. Cl.
| | |
|---|---|
| *H01P 1/26* | (2006.01) |
| *H01P 1/22* | (2006.01) |
| *H01P 11/00* | (2006.01) |
| *H03H 7/24* | (2006.01) |
| *H03H 7/38* | (2006.01) |
| *H01P 5/107* | (2006.01) |

(52) U.S. Cl.
CPC .............. *H01P 1/268* (2013.01); *H01P 1/222* (2013.01); *H01P 1/264* (2013.01); *H01P 5/107* (2013.01); *H01P 11/001* (2013.01); *H03H 7/24* (2013.01); *H03H 7/383* (2013.01)

(58) Field of Classification Search
CPC .......... H01P 1/268; H01P 1/222; H01P 1/264; H01P 5/107; H03H 7/24
USPC .............................................. 333/22 R, 81 B
See application file for complete search history.

(56) References Cited

U.S. PATENT DOCUMENTS

2015/0295295 A1 10/2015 Uemichi

FOREIGN PATENT DOCUMENTS

| JP | 62-100704 U | 6/1987 |
|---|---|---|
| JP | 2007-220512 A | 8/2007 |
| JP | 2012-231292 A | 11/2012 |
| WO | 2008/146535 A1 | 12/2008 |
| WO | 2014/104336 A1 | 7/2014 |

OTHER PUBLICATIONS

Notification of Reasons for Refusal dated Sep. 13, 2016, issued in counterpart of Japanese Patent Application No. 2015-246392, w/ English machine translation (12 pages).
Clenet et al."Laminated Waveguide as Radiating Element for Array Applications",IEEE Transaction on Antennas and Propagation, issued in May 2006, vol. 54, No. 5, pp. 1481-1487 (8 pages).
Decision to Grant dated Nov. 22, 2016 issued in counterpart Japanese application No. 2015-246392, with English translation. (3 pages).

*Primary Examiner* — Stephen E Jones
(74) *Attorney, Agent, or Firm* — Westerman, Hattori, Daniels & Adrian, LLP

(57) ABSTRACT

A terminator has an upper dielectric layer provided on an upper broad wall of a post-wall waveguide, and a microstrip line (MSL) provided on the upper dielectric layer. A blind via has one end thereof connected with one end of the MSL and is inserted inside the post-wall waveguide. A chip resistor has one end thereof connected with the other end of the MSL and has the other end thereof connected with the upper broad wall.

13 Claims, 8 Drawing Sheets

TERMINATOR AND TERMINATION METHOD

This Nonprovisional application claims priority under 35 U.S.C. § 119 on Patent Application No. 2015-246392 filed in Japan on Dec. 17, 2015, the entire contents of which are hereby incorporated by reference.

TECHNICAL FIELD

The present invention relates to a terminator including a post-wall waveguide, and a termination method.

BACKGROUND ART

In the field of microwaves and millimeter waves, a passive device constituted by a post-wall waveguide (PWW) is used. Examples of such a passive device include a directional coupler and a diplexer. A terminator constituted by any of such passive devices and having a termination function added to the passive device has conventionally been known.

In connection with the terminator, for example, Patent Literature 1 discloses an arrangement in which termination is performed inside a post-wall waveguide via a mode converter which is realized by blind vias or through holes and provided between a planar line and the post-wall waveguide. According to the arrangement, a part of broad walls of the post-wall waveguide is replaced by a resistance film.

In the arrangement disclosed in Patent Literature 1, specifically, a microwave package has a plurality of metal patterns which serve as a multilayer substrate and are electrically connected with each other via an interlayer via. Between a lower metal pattern and a metal pattern above the lower metal, a pseudo-waveguide tube is formed which are defined by these metal patterns serving as a lower broad wall and an upper broad wall, respectively. On a metal pattern on a side of an upper surface of the microwave package, a microstrip line is provided via a dielectric layer. The microstrip line has one end thereof coupled with the pseudo-waveguide tube via a pseudo-coaxial line, a waveguide tube conversion section, and the like and the other end thereof connected with a microwave switch. A part of the lower broad wall for the pseudo-waveguide tube is constituted by a film resistor.

Accordingly, a microwave signal inputted to the microstrip line is guided to the pseudo-waveguide tube and converted into heat by the film resistor of the lower broad wall so at to be scattered and lost.

CITATION LIST

Patent Literature

Patent Literature 1
Japanese Patent Application Publication Tokukai No. 2012-231292 (Publication date: Nov. 22, 2012)

SUMMARY OF INVENTION

Technical Problem

However, in order to provide the microwave package described in Patent Literature 1, a method may be employed in which a resistance film of a predetermined pattern is deposited before the broad walls and the post wall are formed.

In this case, after the resistance film is deposited on the substrate, the following steps (1) through (3) are carried out: (1) a step of forming through holes in the substrate by etching, drilling, or the like, (2) a step of depositing a broad wall on a surface of the substrate by sputtering, and (3) a step of plating inner surfaces of the through holes, thereby forming conductor posts inside the substrate. Accordingly, the resistance film is exposed to an etching solution (e.g. fluoride solution) used in the etching, plasma present during the sputtering, and the like. Further, the substrate has an elevated temperature during the sputtering, so that the resistance film is also exposed to a high temperature. This gives a heat history to the resistance film. Under their influences, characteristics (e.g., electrical conductivity) of the resistance film may change from the time when the resistance film was deposited. In other words, the terminator in which a part of the broad walls of the post-wall waveguide is replaced with a resistance film may not be able to achieve desired terminal characteristics.

Further, it is necessary to add, to the production process of the terminator, a step (e.g., photolithography etc.) of forming a resistance film of a predetermined pattern. This increases the number of steps for manufacturing the terminator and, accordingly, increases a production cost of the terminator.

The present invention is accomplished in view of the aforementioned problem. An object of the present invention is to provide a terminator which has desired terminal characteristics and can be manufactured with ease and at low cost, and a termination method.

Solution to Problem

In order to attain the object, a terminator in accordance with one aspect of the present invention is a terminator comprising: a post-wall waveguide including: a post wall constituted by a plurality of conductor posts; and a pair of broad walls which, together with the post wall, form a waveguide region, one of the pair of broad walls being provided with a microstrip line on a surface thereof via a dielectric layer; a blind via connected with one end of the microstrip line and inserted inside the waveguide region; and a resistor having one end thereof connected with the other end of the microstrip line and having the other end thereof connected with the one of the pair of broad walls.

Advantageous Effects of Invention

According to the arrangement in accordance with one aspect of the present invention, it is possible manufacture a terminator with ease and at low cost by use of a general-purpose part such as a resistor, without the need for a special manufacturing method.

Figure 13:
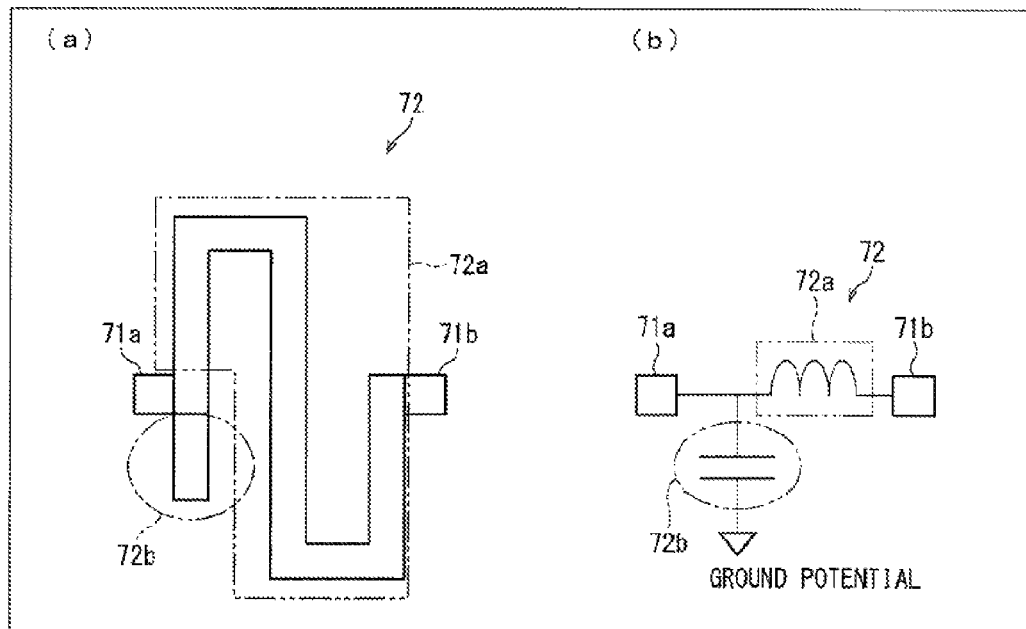

(a) of FIG. 13 is a schematic view illustrating an arrangement of an impedance matching section provided to a microstrip line of a terminator in accordance with still another embodiment of the present invention. (b) of FIG. 13 is a circuit diagram of the impedance matching section illustrated in (a) of FIG. 13.

Figure 14:
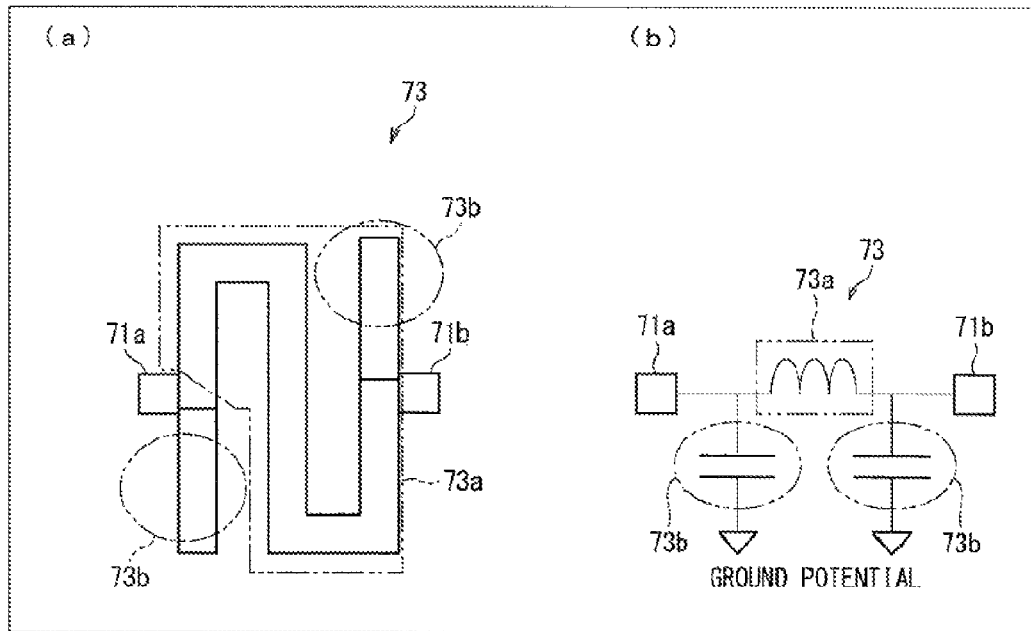

(a) of FIG. 14 is a schematic view illustrating an arrangement of an impedance matching section which is a modified example of the impedance matching section illustrated in (a) of FIG. 13. (b) of FIG. 14 is a circuit diagram of the impedance matching section illustrated in (a) of FIG. 14.

Figure 15:
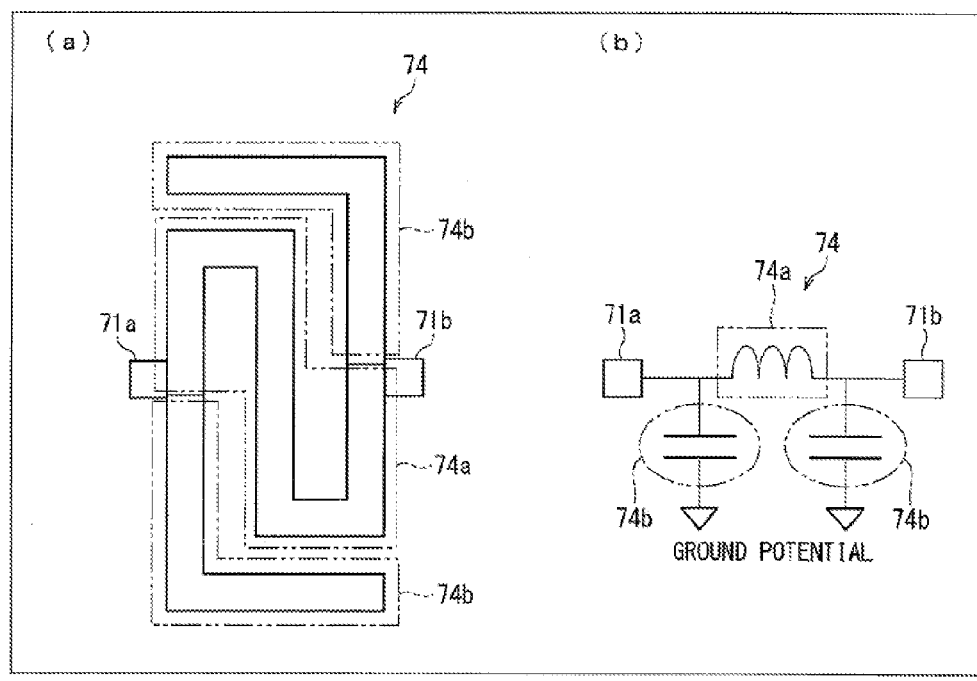

(a) of FIG. 15 is a schematic view illustrating an arrangement of an impedance matching section which is another modified example of the impedance matching section illustrated in (a) of FIG. 13. (b) of FIG. 15 is a circuit diagram of the impedance matching section illustrated in (a) of FIG. 15.

Figure 16:
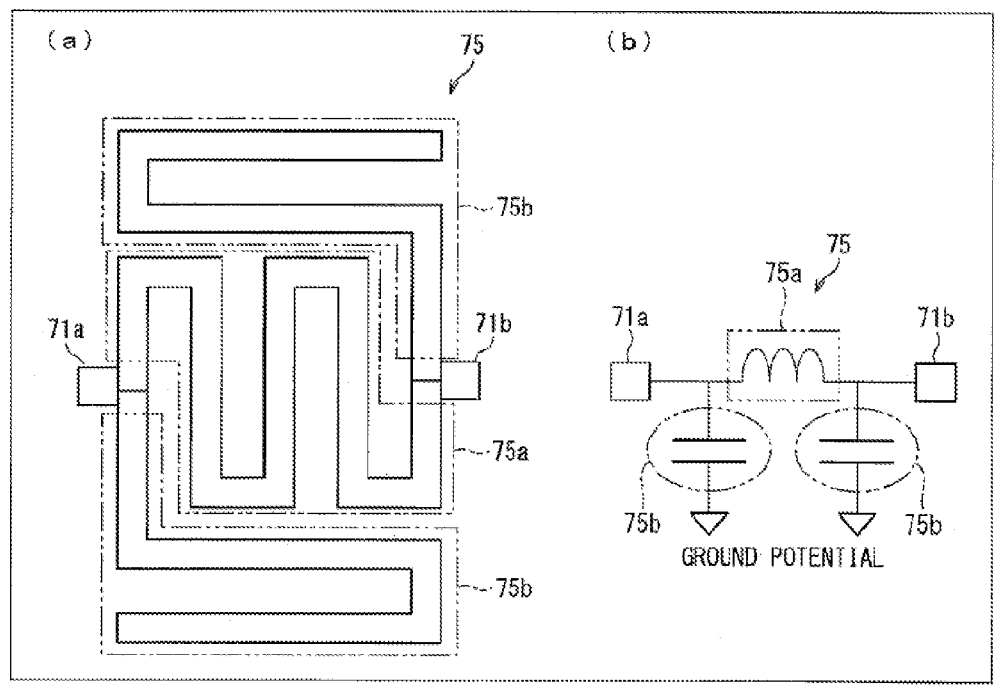

(a) of FIG. 16 is a schematic view illustrating an arrangement of an impedance matching section which is still another modified example of the impedance matching section illustrated in (a) of FIG. 13. (b) of FIG. 16 is a circuit diagram of the impedance matching section illustrated in (a) of FIG. 16.

Figure 17:
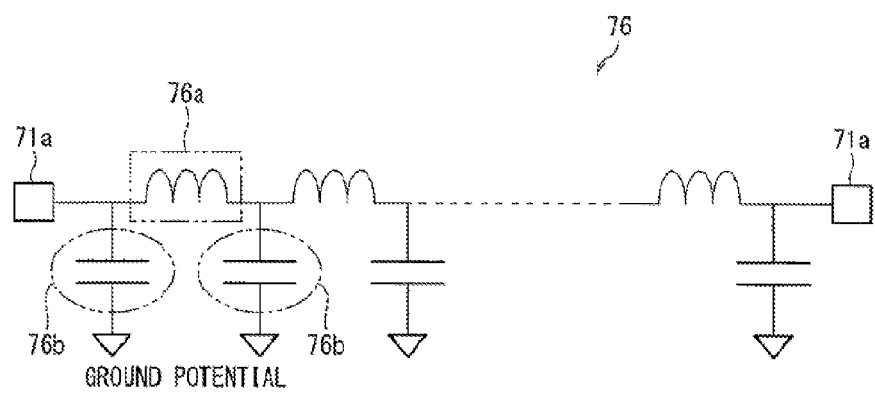

FIG. 17 is a circuit diagram of an arrangement of an impedance matching section in accordance with still another modified example of the impedance matching section illustrated in (b) of FIG. 13.

DESCRIPTION OF EMBODIMENTS

Embodiment 1

Figure 1:
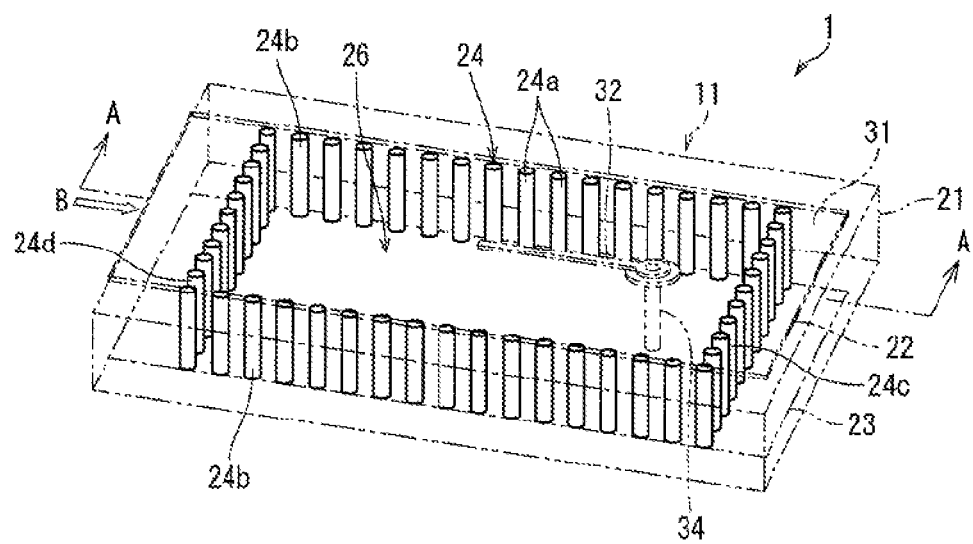
FIG. 1 is a perspective view illustrating an arrangement of a waveguide member of a terminator in accordance with an embodiment of the present invention.
Figure 2:
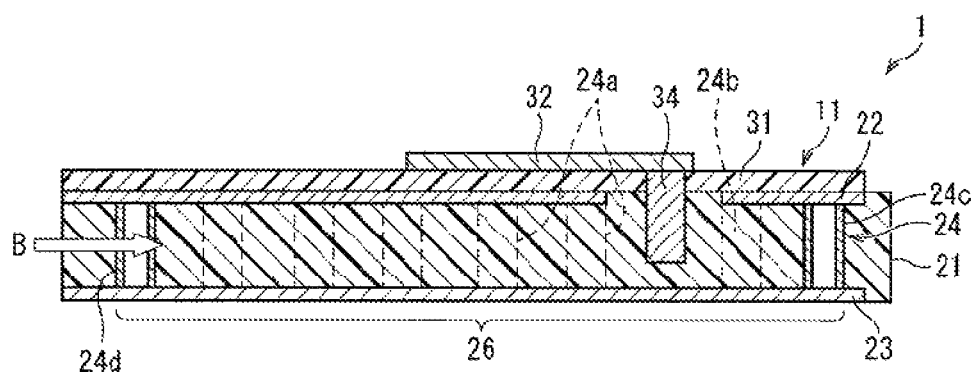
FIG. 2 is a cross-sectional view taken along a line A-A of FIG. 1.

The following description will discuss an embodiment of the present invention with reference to drawings. FIG. 1 is a perspective view illustrating an arrangement of a waveguide member of a terminator in accordance with Embodiment 1 of the present invention. FIG. 2 is a cross-sectional view taken along a line A-A of FIG. 1. In FIG. 1, a post wall 24 is indicated with solid lines and members other than the post wall 24 are indicated with two-dot chain lines, for easy understanding of an internal structure of a terminator 1 (i.e., a waveguide member 11). In FIG. 2, the waveguide member 11 of the terminator 1 is indicated with lines of an originally intended line type, in the cross-sectional view taken along the line A-A.

(Arrangement of Waveguide Member 11)

As illustrated in FIGS. 1 and 2, the terminator 1 includes the waveguide member 11. The waveguide member 11 includes a waveguide section dielectric layer 21 having a large thickness, an upper broad wall 22, a lower broad wall 23, and the post wall 24. Note that FIGS. 1 and 2 also show an upper dielectric layer 31 having a small thickness, a microstrip line 32, and a blind via 34 as well as the waveguide member 11.

Materials for the waveguide section dielectric layer 21 and the upper dielectric layer 31 can be, for example, any of glasses such as quartz glass, fluorine-based resins such as PTFE, liquid crystal polymers, cycloolefin polymers, and the like.

The upper broad wall 22 consists of a conductor layer and is provided on an upper surface of the waveguide section dielectric layer 21. The lower broad wall 23 consists of a conductor layer and is provided on a lower surface of the waveguide section dielectric layer 21. Materials for the upper broad wall 22 and the lower broad wall 23 can be metals such as copper.

The post wall 24 is constituted by a large number of conductor posts 24a which are arranged so as to surround four sides of a rectangular parallelepiped region, and is embedded in the waveguide section dielectric layer 21. Each of the conductor posts 24a is a conductor of, for example, a cylindrical shape, and has an upper end electrically connected with the upper broad wall 22 and a lower end electrically connected with the lower broad wall 23. The conductor posts 24a can be formed, for example, by forming through holes in the waveguide section dielectric layer 21 and then plating wall surfaces of the through holes with a conductor.

A region of the waveguide member 11 which region is surrounded by the upper broad wall 22, the lower broad wall 23, and the post wall 24 serves as a post-wall waveguide 26. A long side direction of the post-wall waveguide 26 coincides with an RF signal incident direction, indicated with an arrow B, in which an RF signal enters. Note that, as illustrated in FIG. 1, a part of the post wall 24 which part extends in a long side direction of the post-wall waveguide 26 is referred to as a side wall 24b, a part of the post wall 24 which part is located at a front end (an end on a positive side in the RF signal incident direction (B direction)) of the post-wall waveguide 26 and extends in a width direction of the post-wall waveguide 26 is referred to as a front wall 24c, and a part of the post wall 24 which part is located in a rear end (an end on a negative side in the RF signal incident direction (B direction)) of the post-wall waveguide 26 and extends in the width direction of the post-wall waveguide 26 is referred to as a rear wall 24d. Note that the front wall 24c and the rear wall 24d are generally called short walls.

(Arrangement of Terminator 1)

Figure 3:
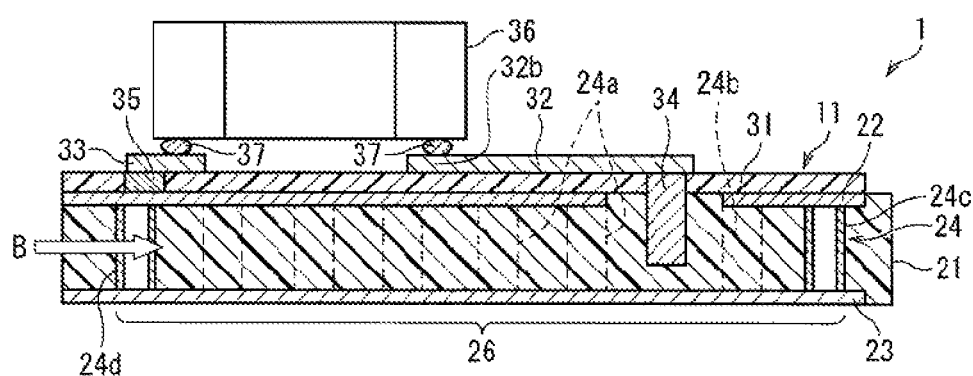
FIG. 3 is a longitudinal cross-sectional view of the terminator in accordance with the embodiment of the present invention.
Figure 4:
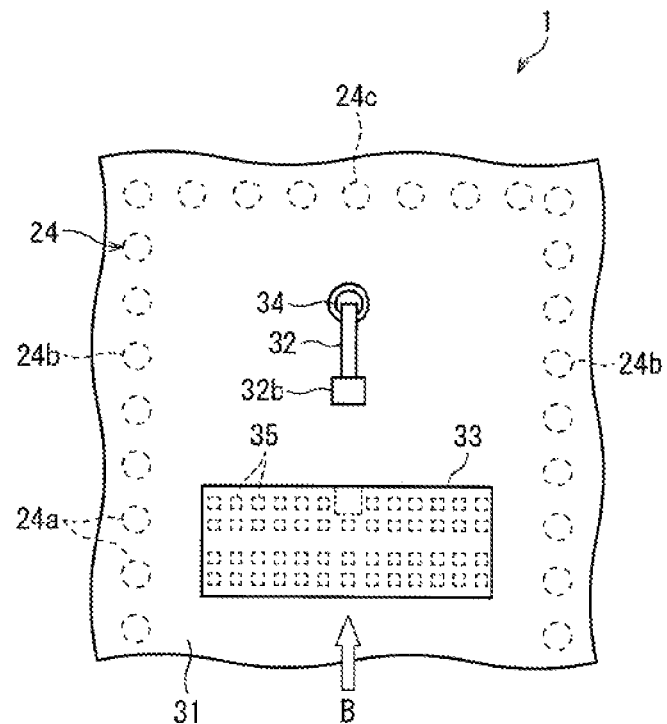
FIG. 4 is a plan view of a substantial part of the terminator illustrated in FIG. 3, the plan view illustrating a layout of a microstrip line and a GND pad on an upper surface of the terminator.

FIG. 3 is a longitudinal cross-sectional view illustrating a configuration of the terminator 1 in accordance with Embodiment 1 of the present invention. FIG. 4 is a plan view of a substantial part of the terminator 1, the plan view illustrating a layout of the microstrip line 32 and a GND pad 33 on an upper surface of the terminator 1. For easy understanding of the layout of the microstrip line 32 and the GND pad 33, a chip resistor 36 is omitted in FIG. 4.

As illustrated in FIG. 3, the terminator 1 is arranged such that the upper dielectric layer 31 is provided on the upper broad wall 22 of the waveguide member 11, and the microstrip line 32 and the GND pad 33 are provided on the upper dielectric layer 31.

As illustrated in FIGS. 3 and 4, the microstrip line 32 is provided on the post-wall waveguide 26 so that, for example, an end (hereinafter referred to as a front end) of the microstrip line 32 which end is on a front wall 24c side is located in a position that is in a central part of the post-wall waveguide 26 in the width direction thereof but slightly closer to the front wall 24c, and the microstrip line 32 extends from this position toward the rear wall 24d. The GND pad 33 is provided in a position on a rear wall 24d side with respect to the microstrip line 32 so as to have a predetermined gap from an end (hereinafter referred to as an RF pad 32b) of the microstrip line 32 which end is on the rear wall 24d side. The GND pad 33 can be of any shape.

On the lower surface of the front end of the microstrip line 32, a blind via 34 which serves as a mode conversion section is provided so as to be suspended from the lower surface. The blind via 34 has, for example, a cylindrical shape and penetrates the upper dielectric layer 31 and the upper broad wall 22 into the waveguide section dielectric layer 21 (into a waveguide region surrounded by the post wall 24, the upper broad wall 22, and the lower broad wall 23) of the post-wall waveguide 26. The lower end of the blind via 34 does not reach the lower broad wall 23. The upper broad wall 22 has provided therein an opening at a position where the blind via 34 is inserted. This prevents the blind via 34 from being short-circuited with the upper broad wall 22.

On a lower surface of the GND pad 33, a connection via 35 is provided. The connection via 35 penetrates the upper dielectric layer 31 and has a lower end connected with the upper broad wall 22.

On the RF pad 32b of the microstrip line 32 and the GND pad 33, the chip resistor (resistor) 36 is provided so as to be suspended therebetween. That is, the chip resistor 36 has one end connected with the RF pad 32b of the microstrip line 32 via a connection layer 37 and has the other end connected with the GND pad 33 via the connection layer 37. Accordingly, the blind via 34 inserted in the post-wall waveguide 26 is connected with the upper broad wall 22 via the microstrip line 32, the chip resistor 36, the GND pad 33, and the connection via 35. That is, a termination state is formed by the chip resistor 36 in the terminator 1 when viewed from the microstrip line 32.

Figure 5:
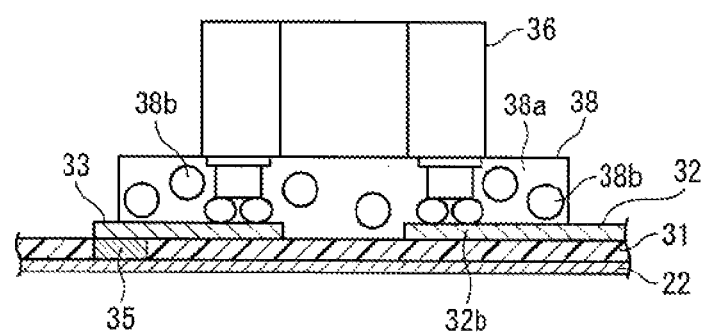
FIG. 5 is a longitudinal cross-sectional view illustrating a state in which, in a case where the connection layer illustrated in FIG. 3 is an anisotropic conductive film, the chip resistor is connected with the GND pad and with an RF pad of the microstrip line.

The connection layer 37 provides connection by means of, for example, SnAgCu solder or AuSn solder which are generally used. Alternatively, the connection layer 37 can provide connection by means of an anisotropic conductive film. FIG. 5 is a longitudinal cross-sectional view illustrating a state in which the chip resistor 36 is connected with the GND pad 33 and with the RF pad 32b of the microstrip line 32 in a case where the connection layer 37 is an anisotropic conductive film 38.

As illustrated in FIG. 5, the anisotropic conductive film 38 is constituted by a resin layer 38a and conductive particles 38b dispersed in the resin layer 38a. The anisotropic conductive film 38 not only serves as the connection layer but also as a filling layer which will be described later.

In a case where the anisotropic conductive film 38 is used, the anisotropic conductive film 38 is disposed between (i) a connecting terminal of the chip resistor 36 and (ii) the RF pad 32b and the GND pad 33. In this state, pressure in a direction toward the RF pad 32b and the GND pad 33 is applied to the chip resistor 36, and the anisotropic conductive film 38 is heated. This causes the conductive particles 38b, which are present between (i) the connecting terminal of the chip resistor 36 and (ii) the RF pad 32b and the GND pad 33, to connect the connecting terminal of the chip resistor 36 with each of the RF pad 32b and the GND pad 33.

Figure 6:
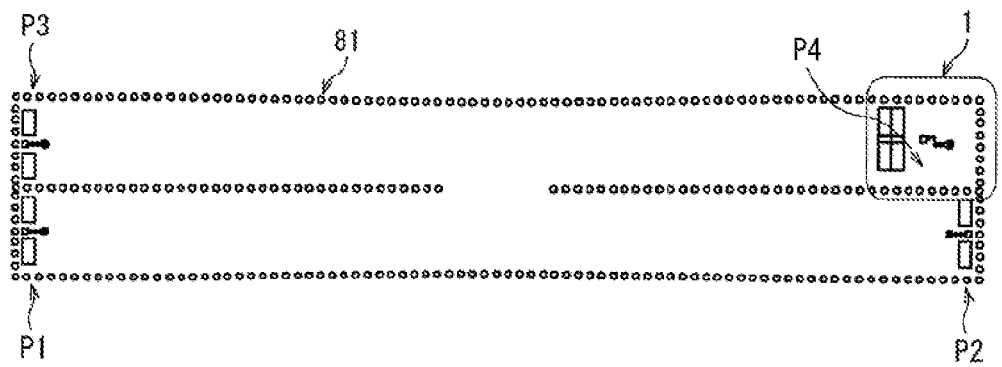
FIG. 6 is a view illustrating an example of how the terminator illustrated in FIG. 1 is used.

FIG. 6 is a view illustrating an example of how the terminator in accordance with Embodiment 1 is used. In the example illustrated in FIG. 6, the terminator 1 is used connected to a directional coupler 81. The directional coupler 81 includes first through third ports P1 through P3 and an isolation port P4, and the terminator 1 is connected to the isolation port P4. Note that the directional coupler 81 functions as a diplexer when combined with a band-pass filter and another directional coupler.

(Operation of Terminator 1)

The following describes how the terminator 1 operates in the arrangement described above. In the terminator 1, an RF signal which travels in the post-wall waveguide 26 of the waveguide member 11 in the RF signal incident direction (B direction) is converted into a high-frequency current by the blind via 34 which serves as the mode conversion section. The high-frequency current flows into the upper broad wall 22 via the microstrip line 32, the chip resistor 36, the GND pad 33, and the connection via 35. In this case, the high-frequency current is attenuated by passing through the chip resistor 36.

(Advantage of Terminator 1)

The terminator 1 thus has an arrangement in which an RF signal, which is an electromagnetic wave traveling in the post-wall waveguide 26 of the waveguide member 11, is converted into a high-frequency current by the blind via 34 inserted in the post-wall waveguide 26, and the high-frequency current is attenuated by the chip resistor 36 provided on the upper surface of the waveguide member 11. The terminator 1 can therefore be manufactured with ease and at low cost by use of a general-purpose part such as the chip resistor 36, without the need for a special manufacturing method.

Further, since the chip resistor 36 is provided so as to be contained within the region of the post-wall waveguide 26 when viewed from above, it is possible to achieve a compact arrangement without an increase in size of the terminator 1 lengthwise and crosswise (in a direction parallel to the upper broad wall 22 and the lower broad wall 23).

Note that although Embodiment 1 employs an arrangement in which the microstrip line 32 and the GND pad 33 are provided on the upper broad wall 22 via the upper dielectric layer 31, it is possible to employ an arrangement in which the microstrip line 32 and the GND pad 33 are provided under the lower broad wall 23 via a lower dielectric layer which is an equivalent of the upper dielectric layer 31. In this case, the connection via 35 provided to the GND pad 33 penetrates the lower dielectric layer so as to be connected with the lower broad wall 23. This also applies to each of other embodiments described later.

Embodiment 2

The following description will discuss another embodiment of the present invention with reference to a drawing. For easy explanation, reference signs will not be given to members each having the same function as a member described in Embodiment 1, and descriptions on such a member will be omitted.

(Arrangement of Terminator 2)

Figure 7:
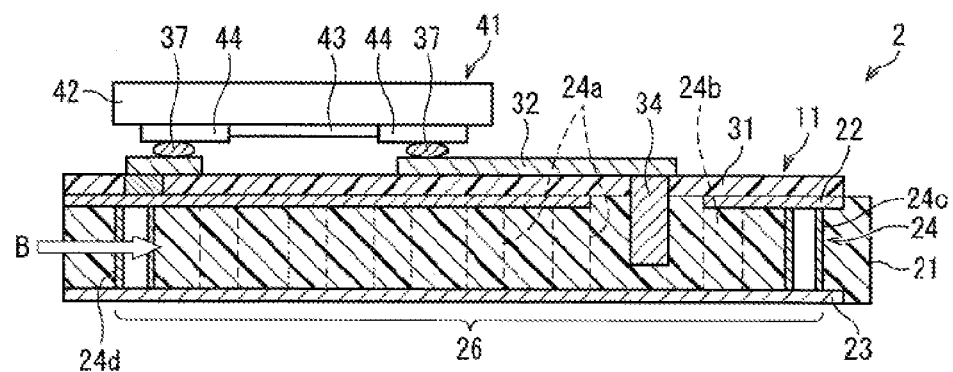
FIG. 7 is a longitudinal cross-sectional view illustrating an arrangement of a terminator in accordance with another embodiment of the present invention.

FIG. 7 is a longitudinal cross-sectional view illustrating an arrangement of a terminator 2 in accordance with Embodiment 2 of the present invention. The terminator 2 includes a thin film resistor substrate (resistor) 41 in place of the chip resistor 36 of the terminator 1 illustrated in FIG. 3.

Other arrangements of the terminator 2 are similar to those of the terminator 1 illustrated in FIG. 3.

As illustrated in FIG. 7, the thin film resistor substrate 41 includes a supporting substrate 42, a thin-film resistor 43, and connection sections 44 provided at respective both ends of the thin-film resistor 43. The thin-film resistor 43 and the connection sections 44 are provided on a lower surface of the supporting substrate 42. The supporting substrate 42 is, for example, a substrate made of resin, ceramic, or silicon.

The thin film resistor substrate 41 is suspended between a microstrip line 32 and a GND pad 33 while having one of the connection sections 44 connected with an RF pad 32b of the microstrip line 32 and the other of the connection sections 44 connected with the GND pad 33. Accordingly, a blind via 34 inserted in a post-wall waveguide 26 is connected with an upper broad wall 22 via the microstrip line 32, the thin film resistor substrate 41, the GND pad 33, and a connection via 35.

(Operation of Terminator 2)

In the terminator 2, a high-frequency current converted from an RF signal, which is an electromagnetic wave, by the blind via 34 flows into the upper broad wall 22 via the microstrip line 32, the thin film resistor substrate 41, the GND pad 33, and the connection via 35. In this case, the high-frequency current is attenuated by passing through the thin film resistor substrate 41.

(Advantage of Terminator 2)

The terminator 2 has an arrangement in which a high-frequency current converted from an RF signal, which is an electromagnetic wave, by the blind via 34 is attenuated by the thin film resistor substrate 41 provided on the upper surface of the waveguide member 11. Accordingly, the terminator 2 has a similar advantage as the terminator 1. That is, the terminator 2 can be manufactured with ease and at low cost by use of the thin film resistor substrate 41 having a simple arrangement, without the need for a special manufacturing method.

Further, since the chip resistor 41 can be provided on the upper surface of the waveguide member 11, it is possible to achieve a compact arrangement without an increase in size of the terminator 2 lengthwise and crosswise (in a direction parallel to the upper broad wall 22 and a lower broad wall 23).

Embodiment 3

The following description will discuss still another embodiment of the present invention with reference to a drawing. For easy explanation, reference signs will not be given to members each having the same function as a member described in Embodiments 1 and 2, and descriptions on such a member will be omitted.

(Arrangement of Terminator 3)

Figure 8:
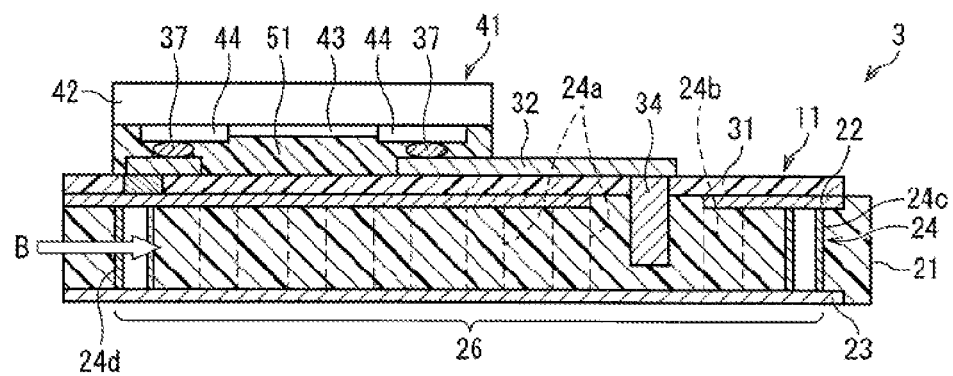
FIG. 8 is a longitudinal cross-sectional view illustrating an arrangement of a terminator in accordance with still another embodiment of the present invention.

FIG. 8 is a longitudinal cross-sectional view illustrating an arrangement of a terminator 3 in accordance with Embodiment 3 of the present invention. The terminator 3 includes a filling layer 51 between (i) a microstrip line 32, a GND pad 33, and an upper dielectric layer 31 and (ii) a thin film resistor substrate 41.

As illustrated in FIG. 8, the filling layer 51 is a layer which causes a dielectric loss, and serves as an attenuation layer which supplements attenuation of a high-frequency current in the thin film resistor substrate 41. The filling layer 51 is preferably made of a material having a large dielectric loss tangent (tanδ), and examples of the material include resin, a conductive adhesive (e.g., silver paste), and a resin (e.g., an anisotropic conductive film) in which conductive particles are dispersed. By employing a resin layer 38a made of a resin having a large dielectric loss tangent, it is possible to increase the dielectric loss and reliably attenuate the high-frequency current, accordingly. Other arrangements of the terminator 3 are similar to those of the terminator 2 illustrated in FIG. 7.

(Advantage of Terminator 3)

The terminator 3 has an arrangement in which a high-frequency current converted from an RF signal, which is an electromagnetic wave, by the blind via 34 is attenuated in the thin film resistor substrate 41 and the filling layer 51 provided on an upper surface of a waveguide member 11. This allows the terminator 3 to improve the function of attenuating a high-frequency current in the filling layer 51, and thus have an enhanced function as a terminator.

Further, the terminator 3 can be manufactured with ease and at low cost by use of the thin film resistor substrate 41 and the filling layer 51 each having a simple arrangement, without the need for a special manufacturing method. Further, as with the terminator 1, the terminator 3 has the advantage of having a compact arrangement.

Embodiment 4

The following description will discuss still another embodiment of the present invention with reference to drawings. For easy explanation, the same reference signs will be given to members each having the same function as a member described in Embodiments 1 through 3, and descriptions on such a member will be omitted.

(Arrangement of Waveguide Member 12)

Figure 9:
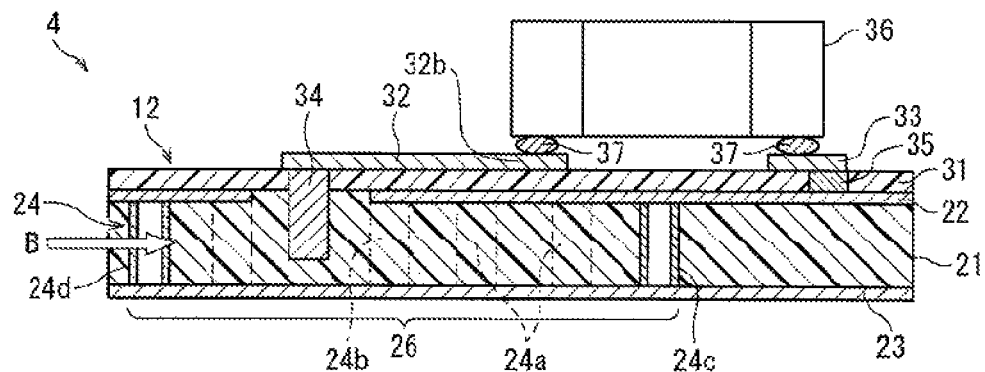
FIG. 9 is a longitudinal cross-sectional view illustrating an arrangement of a terminator in accordance with still another embodiment of the present invention.
Figure 10:
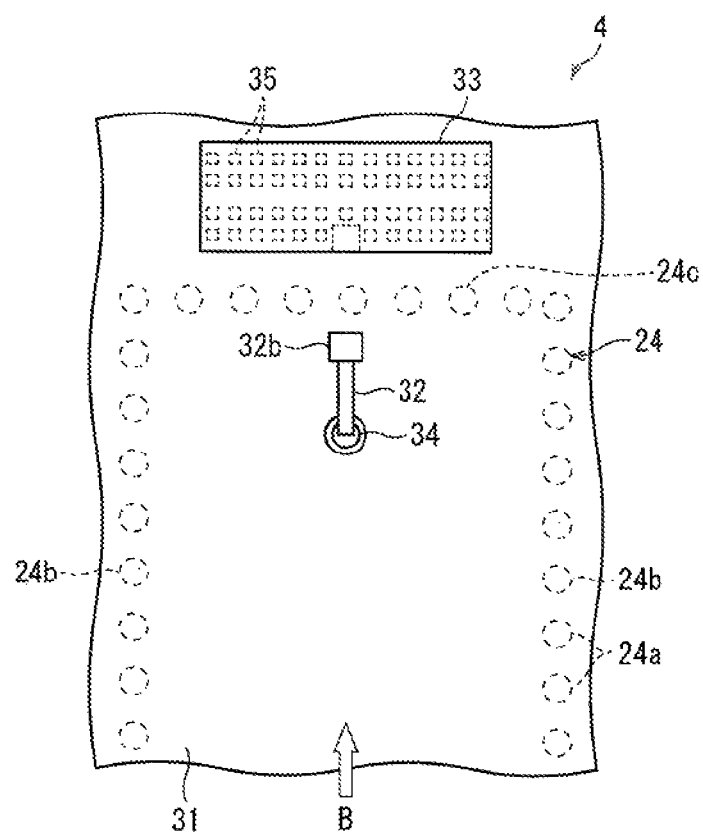
FIG. 10 is a plan view of a substantial part of the terminator illustrated in FIG. 9, the plan view illustrating a layout of a microstrip line and a GND pad on an upper surface of the terminator.

FIG. 9 is a longitudinal cross-sectional view illustrating an arrangement of a terminator 4 in accordance with Embodiment 4 of the present invention. FIG. 10 is a plan view of a substantial part of the terminator 4, the plan view illustrating a layout of a microstrip line 32 and a GND pad 33 on an upper surface of the terminator 4. For easy understanding of the layout of the microstrip line 32 and the GND pad 33, a chip resistor 36 is omitted in FIG. 10.

As illustrated in FIG. 9, the terminator 4 includes a waveguide member 12 in place of the waveguide member 11 illustrated in FIG. 1. In the waveguide member 12, a waveguide section dielectric layer 21, an upper broad wall 22, a lower broad wall 23, and an upper dielectric layer 31 are extended from a front wall 24c of a post-wall waveguide 26 in an RF signal incident direction (B direction). Accordingly, in a case where an end of each of the waveguide members 12 and 11 which end is on a positive side of the RF signal incident direction (B direction) is referred to as a front end, a length from the front wall 24c of the post-wall waveguide 26 to the front end is greater in the waveguide member 12 than in the waveguide member 11.

(Arrangement of Terminator 4)

As illustrated in FIGS. 9 and 10, the terminator 4 has an arrangement in which, contrary to the arrangement of the terminator 1, the microstrip line 32 is provided so that an end of the microstrip line 32 which end is on a blind via 34 side is located in a position that is on a side of a rear wall 24d of the post-wall waveguide 26, and the microstrip line 32 extends from this position toward the front wall 24c. When viewed from above, the GND pad 33 is provided outside the region of the post-wall waveguide 26, in a position between the front wall 24c of the post-wall waveguide 26 and the front end of the waveguide member 12.

Accordingly, the chip resistor 36 is provided across the front wall 24c of the post-wall waveguide 26 so as to be suspended between an RF pad 32b of the microstrip line 32 and the GND pad 33. Other arrangements of the terminator 4 are similar to those of the terminator 1 illustrated in FIG. 3.

(Operation and Advantage of Terminator 4)

With the arrangements described above, the terminator 4 operates similarly as the terminator 1.

According to the terminator 4, in a case where, for example, it is not possible to contain, when viewed from above, a whole of the chip resistor 36 within the region of the post-wall waveguide 26 due to design restrictions, the chip resistor 36 is provided across the front wall 24c of the post-wall waveguide 26. This allows suppressing an increase in size of the terminator 4.

Specifically, particularly in a high frequency band such as a millimeter wave band, an entire length of a resistor element such as the chip resistor 36 is preferably as short as possible in terms of electrical length, and a gap between an end of the RF pad 32b of the microstrip line 32 and an end of the GND pad 33 which ends face each other is preferably not greater than about 500 μm. Meanwhile, a conductor post 24a of the front wall 24c of the post-wall waveguide 26 has a diameter of 100 μm to 300 μm, which is relatively close to 500 μm, in a case where the conductor post 24a is formed by a generally practiced through hole formation technique.

By providing the chip resistor 36 across the front wall 24c of the post-wall waveguide 26, therefore, it is possible to reduce, when viewed from above, an amount of protrusion of the region of the chip resistor 36 from the region of the post-wall waveguide 26. That is, when viewed from above, a region required for providing the chip resistor 36, other than the region of the post-wall waveguide 26, can be reduced. This allows preventing an increase in size of the terminator 4.

Further, it was successfully confirmed by an experiment that, as compared with the terminator 1 in which the chip resistor 36 is contained within the region of the post-wall waveguide 26 when viewed from above, the terminator 4, in which the chip resistor 36 is provided across the front wall 24c of the post-wall waveguide 26, is less compact but operates better in conversion of modes in an area between the post-wall waveguide 26 and a termination section (a section connected with the chip resistor 36) of the microstrip line 32. It is accordingly possible to assume that the terminator 4 exhibits good terminal characteristics. It is therefore assumed that the terminator 1 is relatively preferable in a case where compactness as a terminator is prioritized, and the terminator 4 is relatively preferable in a case where terminal characteristics are prioritized. This point also applies to cases where the resistors described in Embodiments 1 through 3 are respectively employed in place of the chip resistor 36. Other advantages of the terminator 4 are similar to those of the terminator 1.

The description above has discussed an example case in which the chip resistor 36 is provided across the front wall 24c. Note, however, that the post wall 24 across which the chip resistor 36 is provided is not limited to the front wall 24c, and can instead be the side wall 24b or the side wall 24d.

Embodiment 5

The following description will discuss still another embodiment of the present invention with reference to a drawing. For easy explanation, the same reference signs will be given to members each having the same function as a member described in Embodiments 1 through 4, and descriptions on such a member will be omitted.

(Arrangement of Terminator 5)

Figure 11:
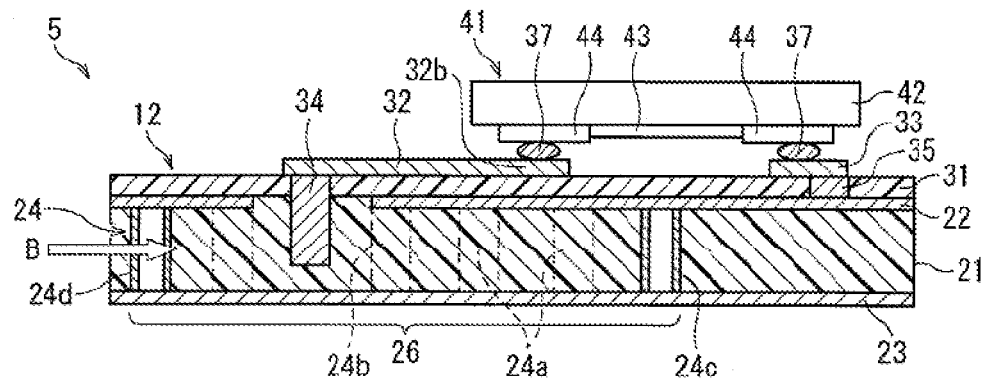
FIG. 11 is a longitudinal cross-sectional view illustrating an arrangement of a terminator in accordance with still another embodiment of the present invention.

FIG. 11 is a longitudinal cross-sectional view illustrating an arrangement of a terminator 5 in accordance with Embodiment 5 of the present invention. The terminator 5 includes a thin film resistor substrate 41 in place of the chip resistor 36 of the terminator 4 illustrated in FIG. 9. Other arrangements of the terminator 5 are similar to those of the terminator 4 illustrated in FIG. 9.

(Operation and Advantage of Terminator 5)

With the arrangement above, the terminator 5 operates similarly as the terminator 1.

Like the terminator 4, as illustrated in FIG. 11, the terminator 5 is arranged such that in a case where it is not possible to contain, when viewed from above, a whole of the thin film resistor substrate 41 within the region of the post-wall waveguide 26 due to design restrictions, the thin film resistor substrate 41 is provided across the front wall 24c of the post-wall waveguide 26. This allows suppressing an increase in size of the terminator 5. Other advantages of the terminator 5 are similar to those of the terminator 1.

Embodiment 6

The following description will discuss still another embodiment of the present invention with reference to a drawing. For easy explanation, reference signs will not be given to members each having the same function as a member described in Embodiments 1 through 5, and descriptions on such a member will be omitted.

(Arrangement of Terminator 6)

Figure 12:
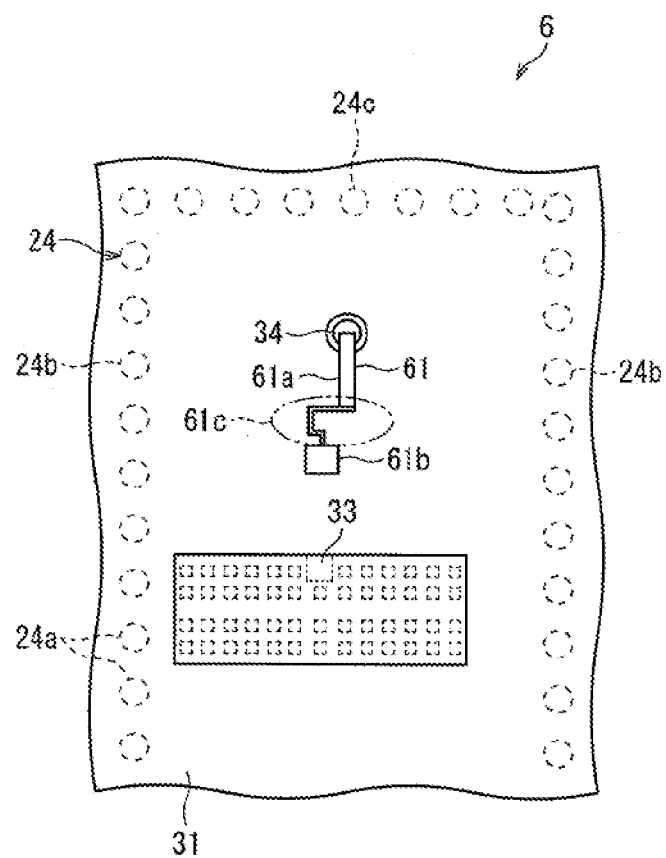
FIG. 12 is a plan view of a substantial part of a terminator in accordance with still another embodiment of the present invention, the plan view illustrating a layout of a microstrip line and a GND pad and an arrangement of the microstrip line on an upper surface of the terminator.

FIG. 12 is a plan view of a substantial part of a terminator 6 in accordance with Embodiment 6 of the present invention, the plan view illustrating a layout of a microstrip line and a GND pad and an arrangement of the microstrip line on an upper surface of the terminator 6. For easy understanding of the terminator 6, a chip resistor 36 and a thin film resistor substrate 41 are omitted in FIG. 12.

As illustrated in FIG. 12, the terminator 6 includes a microstrip line 61 in place of the microstrip line 32. An RF pad of the microstrip line 61 is referred to as an RF pad 61b.

The microstrip line 61 includes an impedance matching section 61c. In the example illustrated in FIG. 12, the impedance matching section 61c is provided between a linear section 61a of the microstrip line 61 and the RF pad 61b. Specifically, the impedance matching section 61c is a serial inductance which is obtained by deforming a part of the microstrip line 61 into a meandering thin line shape. This arrangement of the microstrip line 61 in which the impedance matching section 61c is provided is also applicable to the terminators 1 through 5.

(Operation and Advantage of Terminator 6)

The arrangement in which the microstrip line 61 includes the impedance matching section 61c allows the terminator 6 to have an enhanced function as a terminator.

That is, in general, in a frequency domain of several GHz to several ten GHz, a resistor such as the chip resistor 36 or the thin film resistor substrate 41 may contain an imaginary component due to an influence from a parasitic inductance, a parasitic capacitance, an electrical length, and the like which result from the structure, and as a result, the resistor may fail to serve as a pure resistor. In this case, the imaginary component prevents the resistor from sufficiently attenuating a high-frequency current converted from an RF signal (electromagnetic wave).

In view of this, the impedance matching section 61c is provided to the microstrip line 61, so that an attenuating resistor element has no imaginary component. This allows the terminator 6 to attenuate sufficiently the high-frequency current passing through the microstrip line 61 and, accordingly, have an enhanced function as a terminator.

Embodiment 7

The following description will discuss still another embodiment of the present invention with reference to drawings. For easy explanation, the same reference signs will be given to members each having the same function as a member described in Embodiments 1 through 6, and descriptions on such a member will be omitted.

The terminator 6 illustrated in FIG. 12 can include an impedance matching section 72 illustrated in FIG. 13, in place of the impedance matching section 61c of the microstrip line 61.

(Arrangement of Impedance Matching Section 72)

(a) of FIG. 13 is a schematic view illustrating an arrangement of the impedance matching section 72 provided to a microstrip line 61 of the terminator 6 in accordance with Embodiment 7 of the present invention. (b) of FIG. 13 is a circuit diagram of the impedance matching section 72 illustrated in (a) of FIG. 13.

As illustrated in (a) of FIG. 13, the impedance matching section 72 includes connection sections 71a and 71b. For example, the connection section 71a is connected with a linear section 61a of the microstrip line 61, and the connection section 71b is connected with a RF pad 61b of the microstrip line 61.

A coil section 72a is provided between the connection sections 71a and 71b, and a capacitance section 72b is connected with the connection section 71a. The coil section 72a has a meandering shape. The coil section 72a has an inductance which is set in accordance with a thickness and length of the line of the coil section 72a. The capacitance section 72b is constituted by an open stub which is obtained by linearly extending an end of the coil section 72a. Specifically, the capacitance section 72b is constituted by the open stub, an upper dielectric layer 31, and an upper broad wall 22. The capacitance section 72b has a capacitance that is set in accordance with a size and length of the line of the capacitance section 72b, i.e., a size and length of the open stub. The impedance matching section 72 is an LC circuit of parallel C—series L, as illustrated in (b) of FIG. 13.

That is, the coil section 72a has, between the connection section 71a (one end) and the connection section 71b (the other end), a meandering shape which meanders toward one side and the other side of a direction perpendicular to a straight line that connects between the connection section 71a and the connection section 71b. The capacitance section 72b has a linear section which extends from the end of the coil section 72a in the direction perpendicular to the straight line.

(Advantage of Impedance Matching Section 72)

In the terminator 6 in accordance with Embodiment 7, an attenuating resistor element has no imaginary component due to the provision of the impedance matching section 72.

The impedance matching section 72 has an arrangement in which the capacitance section 72b is connected with the end of the coil section 72a, and a connection section where the coil section 72a and the capacitance section 72b are connected with each other is a connection section 71a which, for example, is connected with the linear section 61a of the microstrip line 61. Thus, the impedance matching section 72 has no unnecessary component between the coil section 72a and the capacitance section 72b, other than the connection section 71a and the linear section 61a. That is, the connection section where the coil section 72a and the capacitance section 72b are connected with each other can be free of an unexpected parasitic component, and accordingly an electrical length of the section can be made completely 0°. This allows the impedance matching section 72 to be particularly effective in the millimeter wave band. Accordingly, the terminator 6 is able to attenuate sufficiently the high-frequency current passing through the microstrip line 61 and accordingly have an enhanced function as a terminator.

Further, since the capacitance section 72b has the linear section which extends along the meandering-shaped region of the coil section 72a, a region in which the coil section 72a and the capacitance section 72b are provided can be made small. This allows the impedance matching section 72 to have a small size.

MODIFIED EXAMPLE 1

(a) of FIG. 14 is a schematic view illustrating an arrangement of an impedance matching section 73 which is a modified example of the impedance matching section 72 illustrated in (a) of FIG. 13. (b) of FIG. 14 is a circuit diagram of the impedance matching section 73 illustrated in (a) of FIG. 14.

As illustrated in (a) of FIG. 14, the impedance matching section 73 includes (i) a coil section 73a which has one end connected with a connection section 71a and the other end connected with a connection section 71b and (ii) two capacitance sections 73b one of which is connected with the connection section 71a and the other of which is connected with the connection section 71b.

The coil section 73a has a meandering shape. The two capacitance sections 73b are constituted by open stubs which are obtained by linearly extending respective both ends of the coil section 73a in directions opposite to each other. Thus, as illustrated in (b) of FIG. 14, the impedance matching section 73 is an LC circuit of parallel C—series L—parallel C. The impedance matching section 73 has similar advantages as those of the impedance matching section 72.

Note that although the example illustrated in (a) and (b) of FIG. 14 employs an arrangement in which the impedance matching section 73 is a CLC circuit (π-type circuit), it is possible to employ instead an arrangement in which the impedance matching section 73 is an LCL circuit (T-type circuit). This point also applies to the examples below.

MODIFIED EXAMPLE 2

(a) of FIG. 15 is a schematic view illustrating an arrangement of an impedance matching section 74 which is another modified example of the impedance matching section 72 illustrated in (a) of FIG. 13. (b) of FIG. 15 is a circuit diagram of the impedance matching section 74 illustrated in (a) of FIG. 15.

As illustrated in (a) of FIG. 15, the impedance matching section 74 includes (i) a coil section 74a which has one end connected with a connection section 71a and the other end connected with a connection section 71b and (ii) two capacitance sections 74b one of which is connected with the connection section 71a and the other of which is connected with the connection section 71b.

The coil section 74a has a meandering shape. The two capacitance sections 74b are constituted by open stubs which are obtained by linearly extending (linear sections) the respective both ends of the coil section 74a in directions opposite to each other and then bending (bent sections) each linear section, for example, at a right angle so that the linear section thus bent extends along the region in which the coil section 74a is provided. Accordingly, the impedance matching section 74 is an LC circuit of parallel C—series L—parallel C as illustrated in (b) of FIG. 15.

That is, the coil section 74a has, between the connection section 71a (one end) and the connection section 71b (the other end), a meandering shape which meander toward one side and the other side of a direction perpendicular to a straight line that connects between the connection section 71a and the connection section 71b. Each capacitance section 74b has (i) a linear section which extends from an end of the coil section 74a in the direction perpendicular to the straight line and (ii) a bent section which is bent from a termination section of the linear section so as to extend along the meandering-shaped region of the coil section 74a.

The impedance matching section 74 has advantages similar to those of the impedance matching section 72. Further, due to the provision of the linear section and the bent section, a region in which each capacitance section 74b is provided can be made small, even in a case where the capacitance is increased. This allows the impedance matching section 74 to have a small size.

MODIFIED EXAMPLE 3

(a) of FIG. 16 is a schematic view illustrating an arrangement of an impedance matching section 75 which is still another modified example of the impedance matching section 72 illustrated in (a) of FIG. 13. (b) of FIG. 16 is a circuit diagram of the impedance matching section 75 illustrated in (a) of FIG. 16.

As illustrated in (a) of FIG. 15, the impedance matching section 75 includes (i) a coil section 75a which has one end connected with a connection section 71a and the other end connected with a connection section 71b and (ii) two capacitance sections 75b one of which is connected with the connection section 71a and the other of which is connected with the connection section 71b.

The coil section 75a has a meandering shape which meanders for an increased number of times as compared with the coil section 72a. The two capacitance sections 75b are constituted by open stubs which are obtained by (i) linearly extending (linear sections) respective both ends of the coil section 75a in directions opposite to each other, (ii) subsequently bending (bent sections) each linear section, for example, at a right angle so that the linear section thus bent extends along the region in which the coil section 75a is provided, and (iii) further bending the bent section twice, for example, at a right angle, from an end of the region in which the coil section 75a is provided so that the bent section thus bent extends in an opposite direction. Thus, the impedance matching section 75 is an LC circuit of parallel C—series L—parallel C as illustrated in (b) of FIG. 16.

That is, the coil section 75a has, between the connection section 71a (one end) and the connection section 71b (the other end), a meandering shape which meanders toward one side and the other side of a direction perpendicular to a straight line that connects between the connection section 71a and the connection section 71b. Each capacitance section 75b is constituted by an open stub which (i) has a linear section which extends from an end of the coil section 75a in the direction perpendicular to the straight line and a bent section which is bent from a termination section of the linear section so as to extend along the meandering-shaped region of the coil section 75a and (ii) is further bent twice, for example, at a right angle, from an end (termination section of the bent section) of the region in which the coil section 74a is provided, so as to extend in an opposite direction. The impedance matching section 75 has advantages similar to those of the impedance matching section 74.

MODIFIED EXAMPLE 4

(a) of FIG. 17 is a circuit diagram illustrating an arrangement of an impedance matching section 76 which is still another modified example of the impedance matching section 72 illustrated in (b) of FIG. 13.

As illustrated in FIG. 17, the impedance matching section 76 includes a plurality of impedance matching sections (each made up of a set of a coil section and a capacitance section) which are any of the above-described impedance matching sections and provided in multiple stages. Any of the above-described coil sections and any of the above-described capacitance sections can be employed as a coil section 76a and a capacitance section 76b, respectively. Thus, the impedance matching section 76 is an LC circuit of parallel C—series L—parallel C . . . series L—parallel C. The impedance matching section 76 has advantages similar to those of the impedance matching section 72.

Further, since the impedance matching section 76 has an arrangement in which, for example, CLC circuits (π-type circuits) are provided in multiple stages, it is possible to broaden a frequency band in which impedance matching is carried out. The arrangement also allows changing a real component of the impedance.

CONCLUSION

A terminator in accordance with one aspect of the present invention is a terminator comprising: a post-wall waveguide including: a post wall constituted by a plurality of conductor posts; and a pair of broad walls which, together with the post wall, form a waveguide region, one of the pair of broad walls being provided with a microstrip line on a surface thereof via a dielectric layer; a blind via connected with one end of the microstrip line and inserted inside the waveguide region; and a resistor having one end thereof connected with the other end of the microstrip line and having the other end thereof connected with the one of the pair of broad walls.

According to the arrangement above, an electromagnetic wave traveling inside the post-wall waveguide is converted by the blind via into a high-frequency current and passes through the microstrip line. The high-frequency current further flows into a broad wall of the post-wall waveguide via the resistor, while being attenuated by passing through the resistor.

The terminator as described above can be manufactured with ease and at low cost by use of a general-purpose part such as a resistor, without the need for a special manufacturing method.

The terminator may be arranged such that, when viewed from above, the resistor is contained within a region surrounded by the post wall.

According to the arrangement, the resistor is contained within the region surrounded by the post wall. This prevents an increase in size of the terminator lengthwise and crosswise, and allows achieving a compact arrangement.

The terminator may be arranged such that, when viewed from above, the resistor extends across the post wall from the region surrounded by the post wall to an outside of the region.

According to the arrangement, the resistor extends across the post wall from the region surrounded by the post wall to the outside of the region. This allows reducing, when viewed from above, an amount of protrusion of the region of the resistor from the region surrounded by the post wall. That is, when viewed from above, a region required for providing the resistor, other than the region surrounded by the post wall, can be reduced. This allows preventing an increase in size of the terminator even in a case where it is not possible to contain, when viewed from above, the resistor within the region surrounded by the post wall.

The terminator may be arranged such that the terminator further comprises an attenuation layer provided between the resistor and the one of the pair of broad walls, the attenuation layer being made of a material containing a dielectric.

According to the arrangement, a high-frequency current which passes through the microstrip line after being converted from an electromagnetic wave by the blind via is attenuated by the resistor and further by the attenuation layer. This allows the terminator to have an enhanced function as a terminator.

The terminator may be arranged such that the attenuation layer is an anisotropic conductive film made of (i) a resin which is the dielectric and (ii) conductive particles dispersed in the resin.

According to the arrangement, it is possible to form the attenuation layer by (i) applying, on surfaces of the dielectric layer and the microstrip line, the resin in which the conductive particles are dispersed, (ii) subsequently disposing the resistor on the resin, and (iii) then heat-setting the resin while giving pressure on the resistor. Note that in a case where a temperature for hard-setting the resin is lower than a temperature for soldering the resistor, it is possible to suppress an influence of heat on the post-wall waveguide.

The terminator may be arranged such that the microstrip line is provided with an impedance matching section.

According to the arrangement, the terminator can have an enhanced function as a terminator. That is, in a frequency domain of several GHz to several ten GHz, a resistor may contain an imaginary component due to an influence from a parasitic inductance, a parasitic capacitance, an electrical length, and the like which result from the structure, and as a result, the resistor may fail to serve as a pure resistor. In this case, the imaginary component prevents the resistor from sufficiently attenuating a high-frequency current converted from an electromagnetic wave.

In view of this, the impedance matching section is provided to the microstrip line, so that the resistor has no imaginary component. This allows the terminator to attenuate sufficiently the high-frequency current passing through the microstrip line and, accordingly, have an enhanced function as a terminator.

The terminator may be arranged such that: the impedance matching section has a coil section and a capacitance section connected with an end of the coil section, the capacitance section being constituted by an open stub; and a connection section of the capacitance section where the capacitance section is connected with the coil section is a connection section of the impedance matching section where the impedance matching section is connected with the microstrip line.

According to the arrangement, the impedance matching section has no unnecessary component between the coil section and the capacitance section, other than the connection section. This allows the impedance matching section to operate well as an impedance matching section.

The terminator may be arranged such that the capacitance section is connected only with one end of the coil section in the impedance matching section.

According to the arrangement, it is possible to provide an impedance matching section having a simple and small arrangement.

The terminator may be arranged such that the capacitance section is connected with each of both ends of the coil section in the impedance matching section.

According to the arrangement, it is possible to provide an impedance matching section having a simple and small arrangement in which a coil section and a parallel capacitance section are provided.

The terminator may be arranged such that sets each consisting of the coil section and the capacitance section are provided in multiple stages and connected with each other in the impedance matching section.

According to the arrangement, it is possible to broaden a frequency band in which impedance matching is carried out.

The terminator may be arranged such that: the coil section of the impedance matching section has, between one end and the other end of the coil section, a meandering shape which meanders toward one side and the other side of a direction perpendicular to a straight line that connects between the one end and the other end; and the capacitance section has a linear section extending from an end of the coil section in the direction perpendicular to the straight line.

According to the arrangement, the capacitance section has the linear section which extends along the meandering-shaped region of the coil section. As such, a region in which the coil section and the capacitance section are provided can be made small. This allows the impedance matching section to have a small size.

The terminator may be arranged such that the capacitance section has a bent section which bends from a termination section of the linear section so as to extend along a meandering-shaped region of the coil section.

According to the arrangement, the capacitance section of the impedance matching section has the bent section which is bent from the termination section of the linear section so as to extend along the meandering-shaped region of the coil section. As such, due to the provision of the linear section and the bent section, a region in which the capacitance section is provided can be made small, even in a case where the capacitance is increased.

A termination method in accordance with one aspect of the present invention is a termination method comprising the steps of: providing a microstrip line, via a dielectric layer, on a surface of one of a pair of broad walls of a post-wall waveguide, the post-wall waveguide including: a post wall constituted by a plurality of conductor posts; and the pair of broad walls which, together with the post wall, form a waveguide region; providing a blind via which is connected with one end of the microstrip line and inserted inside the waveguide region; and providing a resistor which has one end thereof connected with the other end of the microstrip line and has the other end thereof connected with the one of the pair of broad walls.

According to the arrangement above, advantageous effects similar to those of the terminator are provided.

The present invention is not limited to the embodiments, but can be altered by a skilled person in the art within the scope of the claims. An embodiment derived from a proper combination of technical means each disclosed in a different embodiment is also encompassed in the technical scope of the present invention.

REFERENCE SIGNS LIST 1 through 6: terminator
11 and 12: waveguide member
21: waveguide section dielectric layer
22: upper broad wall
23: lower broad wall
24: post wall
24a: conductor post
24b: side wall
24c: front wall
24d: rear wall
31: upper dielectric layer
32: microstrip line
32b: RF pad
33: GND pad
34: blind via
35: connection via
36 : chip resistor (resistor)
37: connection layer
38: anisotropic conductive film (connection layer, attenuation layer)
41: thin film resistor substrate (resistor)
51: filling layer (attenuation layer)
61: microstrip line
61a: linear section
61b: RF pad
61c: impedance matching section
71a: connection section
71b: connection section
72: impedance matching section
72a: coil section
72b: capacitance section
72: impedance matching section
72a: coil section
72b: capacitance section
73: impedance matching section
73a: coil section
73b: capacitance section
74: impedance matching section
74a: coil section
74b: capacitance section
75: impedance matching section
75a: coil section
75b: capacitance section
76: impedance matching section
76a: coil section
76b: capacitance section
81: directional coupler

The invention claimed is:

1. A terminator comprising:
a post wall constituted by a plurality of conductor posts; and
a pair of broad walls which, together with the post wall, form a waveguide region, one of the pair of broad walls being provided with a microstrip line on a surface thereof via a dielectric layer;
a blind via connected with one end of the microstrip line and inserted inside the waveguide region; and
a resistor having one end thereof connected with the other end of the microstrip line and having the other end thereof connected with the one of the pair of broad walls.

2. The terminator as set forth in claim 1, wherein, when viewed from above, the resistor is contained within a region surrounded by the post wall.

3. The terminator as set forth in claim 1, wherein, when viewed from above, the resistor extends across the post wall from the region surrounded by the post wall to an outside of the region.

4. The terminator as set forth in claim 1, further comprising an attenuation layer provided between the resistor and the one of the pair of broad walls, the attenuation layer being made of a material containing a dielectric.

5. The terminator as set forth in claim 4, wherein the attenuation layer is an anisotropic conductive film made of (i) a resin which is the dielectric and (ii) conductive particles dispersed in the resin.

6. The terminator as set forth in claim 1, wherein the microstrip line is provided with an impedance matching section.

7. The terminator as set forth in claim 6, wherein:
the impedance matching section has a coil section and a capacitance section connected with an end of the coil section, the capacitance section being constituted by an open stub; and
a connection section of the capacitance section where the capacitance section is connected with the coil section is a connection section of the impedance matching section where the impedance matching section is connected with the microstrip line.

8. The terminator as set forth in claim 7, wherein the capacitance section is connected only with one end of the coil section in the impedance matching section.

9. The terminator as set forth in claim 7, wherein the capacitance section is connected with each of both ends of the coil section in the impedance matching section.

10. The terminator as set forth in claim 7, wherein sets each consisting of the coil section and the capacitance section are provided in multiple stages and connected with each other in the impedance matching section.

11. The terminator as set forth in claim 7, wherein:
the coil section of the impedance matching section has, between one end and the other end of the coil section, a meandering shape which meanders toward one side and the other side of a direction perpendicular to a straight line that connects between the one end and the other end; and
the capacitance section has a linear section extending from an end of the coil section in the direction perpendicular to the straight line.

12. The terminator as set forth in claim 11, wherein the capacitance section has a bent section which bends from a termination section of the linear section so as to extend along a meandering-shaped region of the coil section.

13. A termination method comprising the steps of:
providing a microstrip line, via a dielectric layer, on a surface of one of a pair of broad walls of a post-wall waveguide,
the post-wall waveguide including:
a post wall constituted by a plurality of conductor posts; and
the pair of broad walls which, together with the post wall, form a waveguide region;
providing a blind via which is connected with one end of the microstrip line and inserted inside the waveguide region; and
providing a resistor which has one end thereof connected with the other end of the microstrip line and has the other end thereof connected with the one of the pair of broad walls.

* * * * *